United States Patent [19]

Rao

[11] Patent Number: 4,903,237

[45] Date of Patent: Feb. 20, 1990

[54] DIFFERENTIAL SENSE AMPLIFIER CIRCUIT FOR HIGH SPEED ROMS, AND FLASH MEMORY DEVICES

[75] Inventor: Kameswara K. Rao, San Jose, Calif.

[73] Assignee: Catalyst Semiconductor, Inc., Santa Clara, Calif.

[21] Appl. No.: 227,584

[22] Filed: Aug. 2, 1988

[51] Int. Cl.$^4$ .............................................. G11C 13/00
[52] U.S. Cl. .................................. 365/185; 307/530; 365/210; 365/226
[58] Field of Search ................. 307/530, 210; 365/185, 365/226, 227, 189.04, 189.05

[56] References Cited

U.S. PATENT DOCUMENTS

| | | | |
|---|---|---|---|
| 4,223,394 | 9/1980 | Pathak et al. | 365/210 |
| 4,301,518 | 11/1981 | Klaas | 365/185 |
| 4,535,259 | 8/1985 | Smarandoiu et al. | 307/530 |
| 4,722,075 | 1/1988 | Kaszubinski et al. | 365/226 |

OTHER PUBLICATIONS

Zeman et al., "A 55 ns CMOS EEPROM", published at the 1984 IEEE International Solid State Circuits Conference, pp. 144–145.
Pathak et al., "A 25 ns 16K CMOS PROM Using a 4-Transistor Cell", published at the 1985 IEEE Solid State Circuits Conference, pp. 162–163.
Ali et al., "A 50-ns 256K CMOS Split-Gate EPROM", IEEE Journal of Solid State Circuits, Feb. 1988.
Komatsu et al., "A 35-ns 128Kx8 CMOS SRAM", IEEE Journal of Solid-State Circuits, Oct. 1987.
Wada et al., "A 34-ns 1-Mbit CMOS SRAM using Triple Polysilicon", IEEE Journal of Solid State Circuits, Oct. 1987.
Gubbels et al., "A 40-ns/100pF Low-Power Full-CMOS 256K (32Kx8) SRAM", IEEE Journal of Solid State Circuits, Oct. 1984.
Okazaki et al., "A 16 ns 2Kx8 Bit Full CMOS SRAM", IEEE Journal of Solid State Circuits, Oct. 1984.
McCreary et al., "Techniques for a 5-V-Only 65K EPROM Based on Substrate Hot-Electron Injection", IEEE Journal of Solid State Circuits, (Feb. 1984).
Atsumi et al., "Fast Programmable 256K Read Only Memory with On-Chip Test Circuits", IEEE Journal of Solid State Circuits, Feb. 1985.

*Primary Examiner*—Terrell W. Fears
*Attorney, Agent, or Firm*—Skjerven, Morrill, MacPherson, Franklin & Friel

[57] ABSTRACT

A circuit senses the state of an EPROM cell transistor and drives an output lead in response thereto. The circuit comprises first and second sense amplifiers, each having inverting and noninverting input leads. The circuit also comprises a reference voltage lead coupled to the inverting lead of the first sense amplifier and the noninverting lead of the second sense amplifier. An EPROM cell transistor is connected to the noninverting lead of the first sense amplifier and the inverting lead of the second sense amplifier. The first sense amplifier is coupled to a first portion of a buffer circuit which couples the output lead to a VCC supply lead, while the second sense amplifier drives a second portion of a buffer circuit which coupled the output lead to ground.

6 Claims, 6 Drawing Sheets

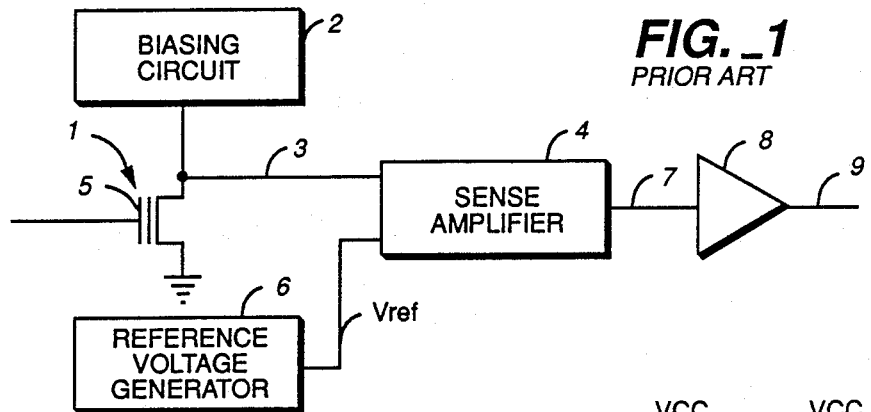
FIG._1
PRIOR ART
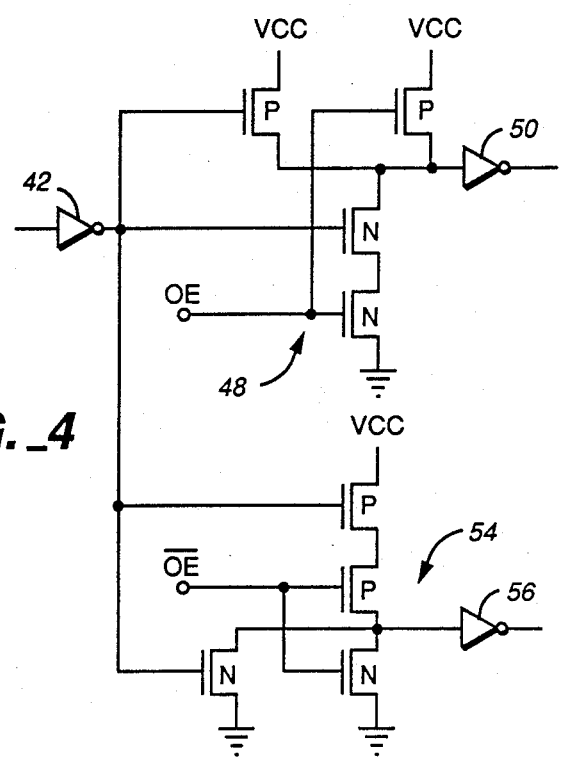
FIG._4
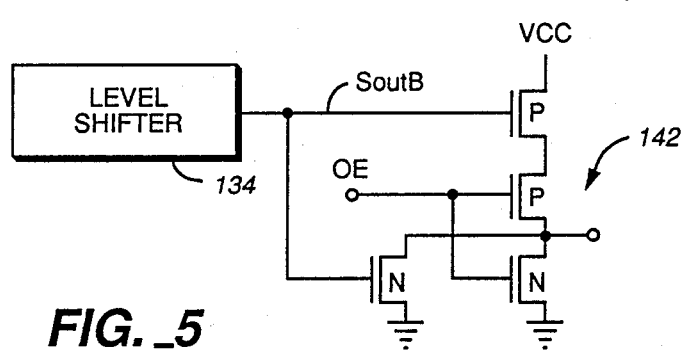
FIG._5

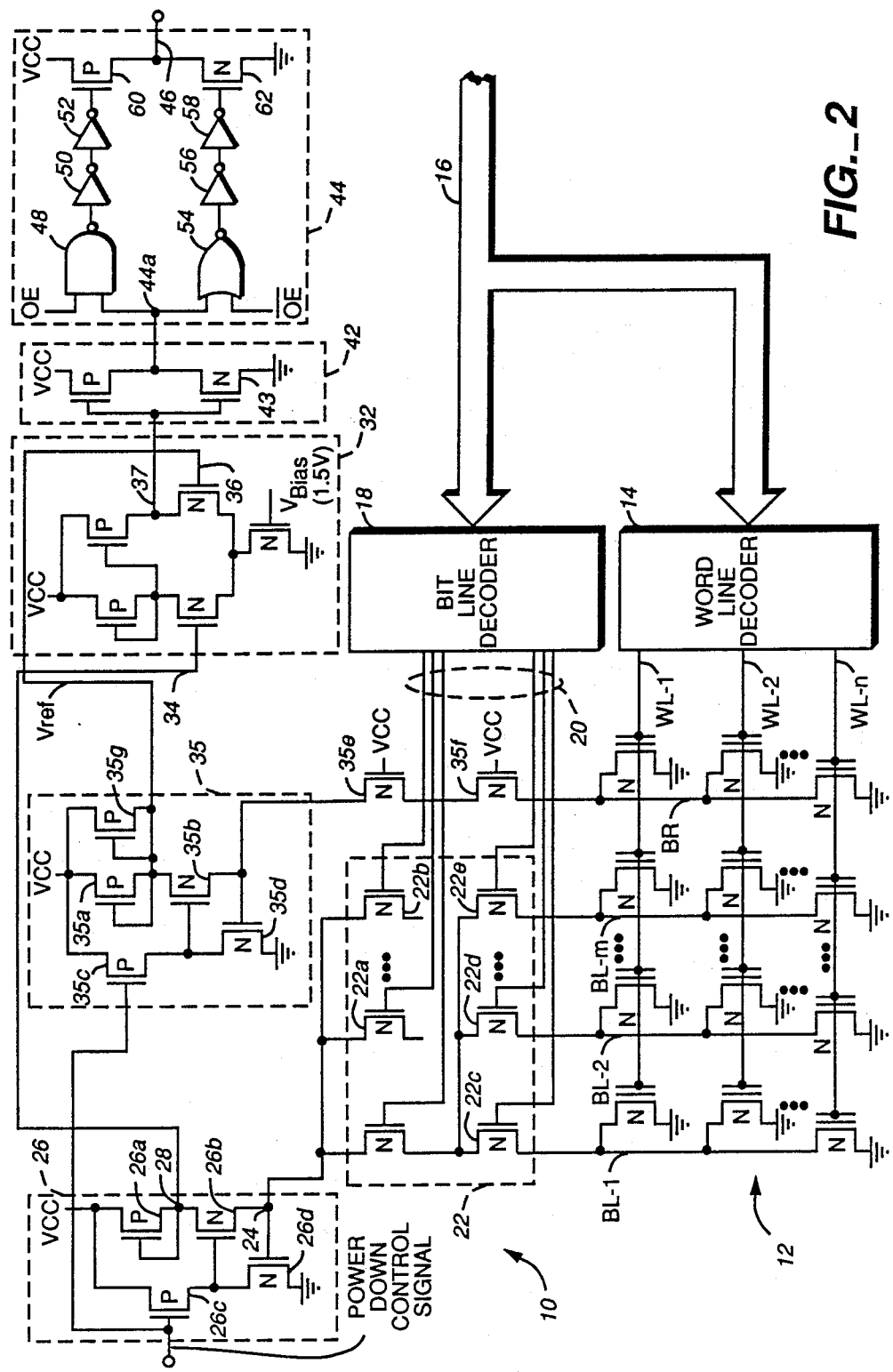
FIG._2

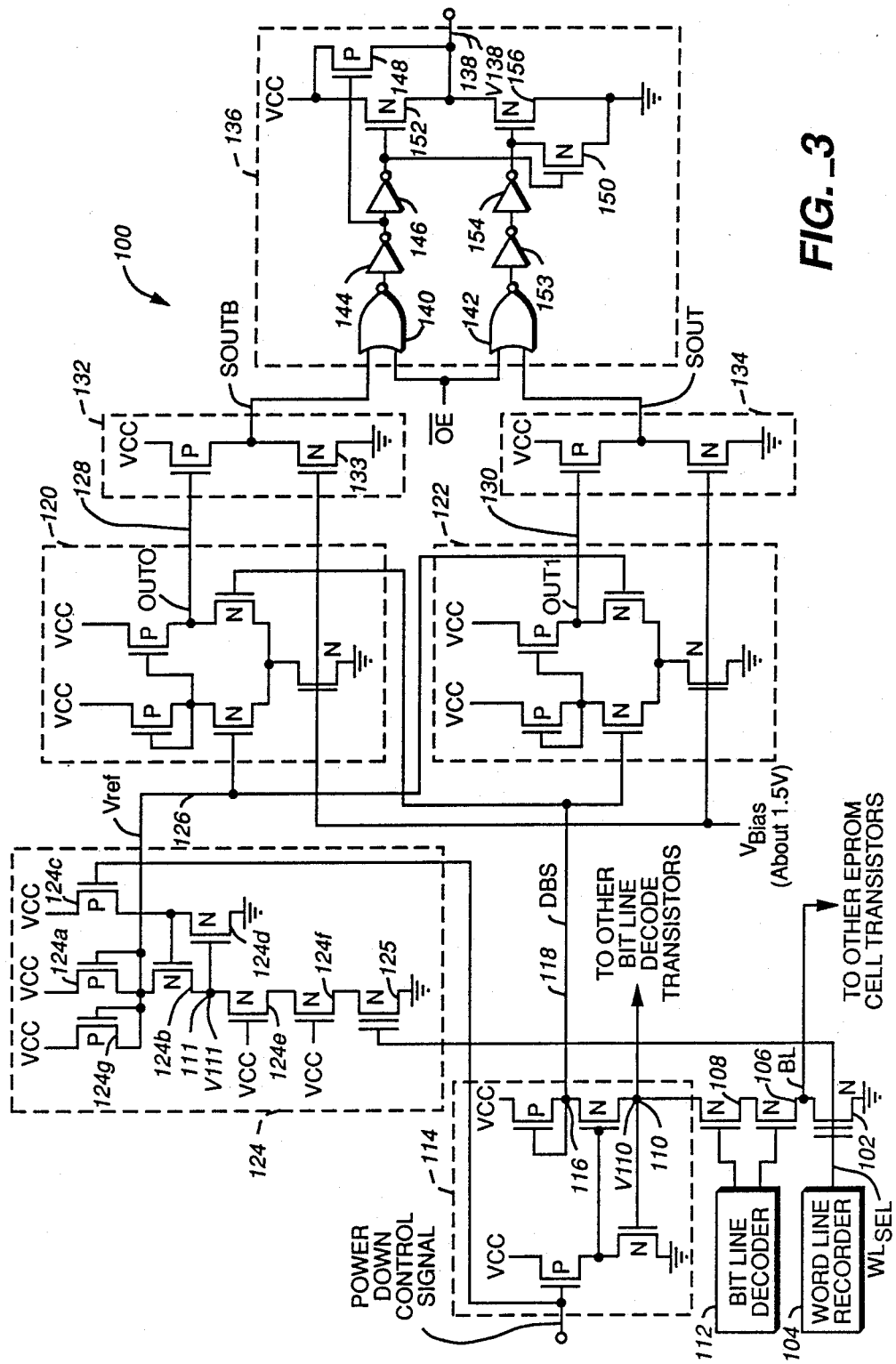
FIG._3

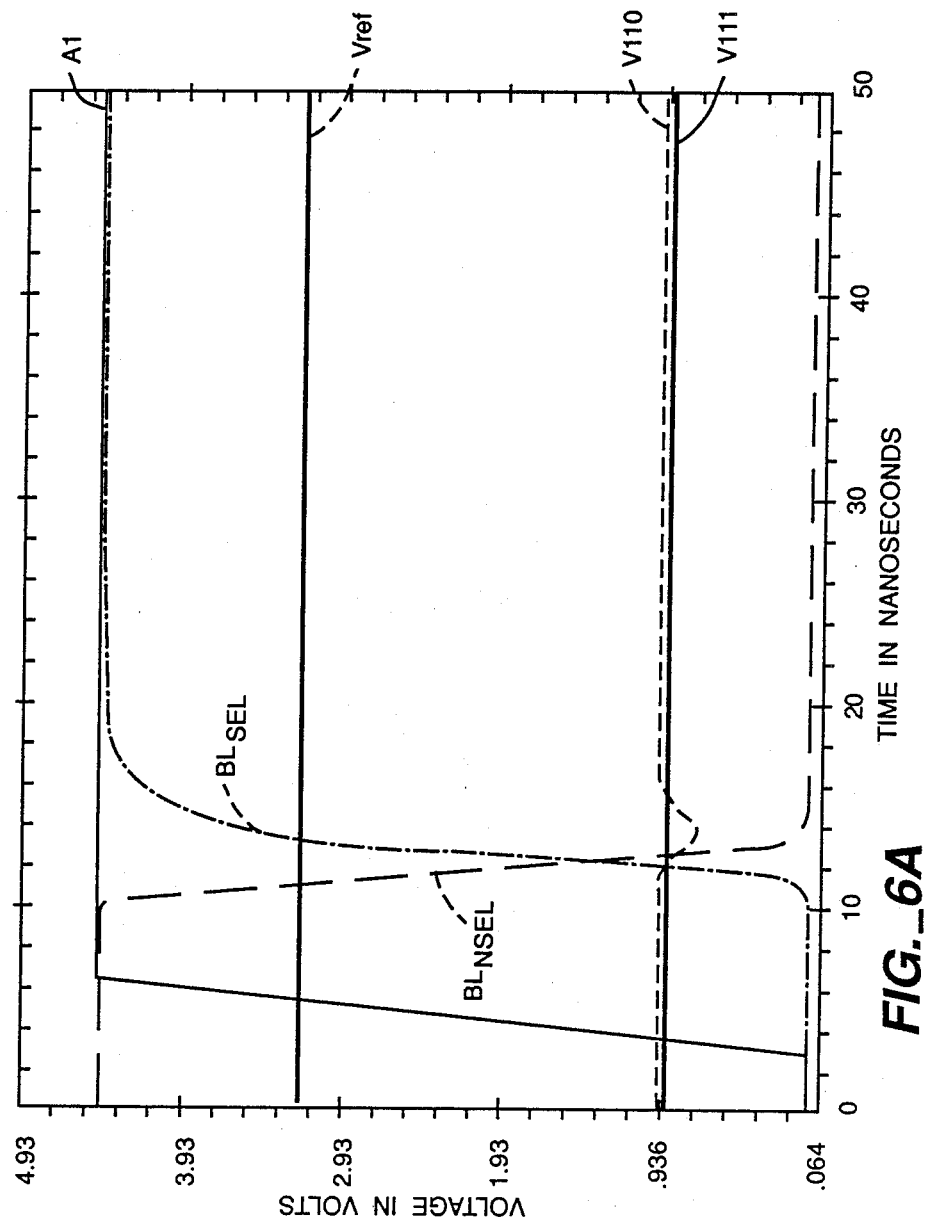
FIG._6A

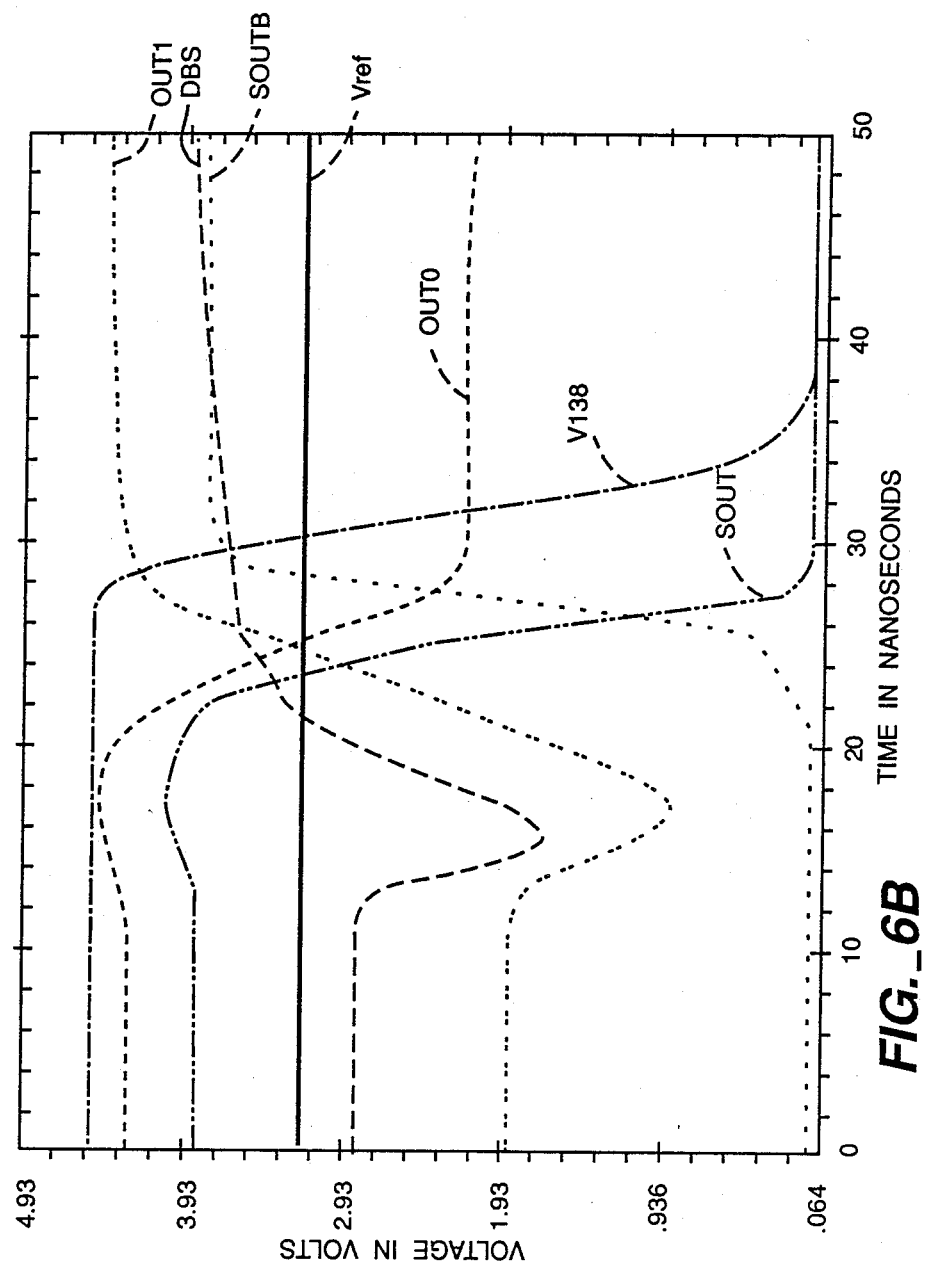
FIG._6B

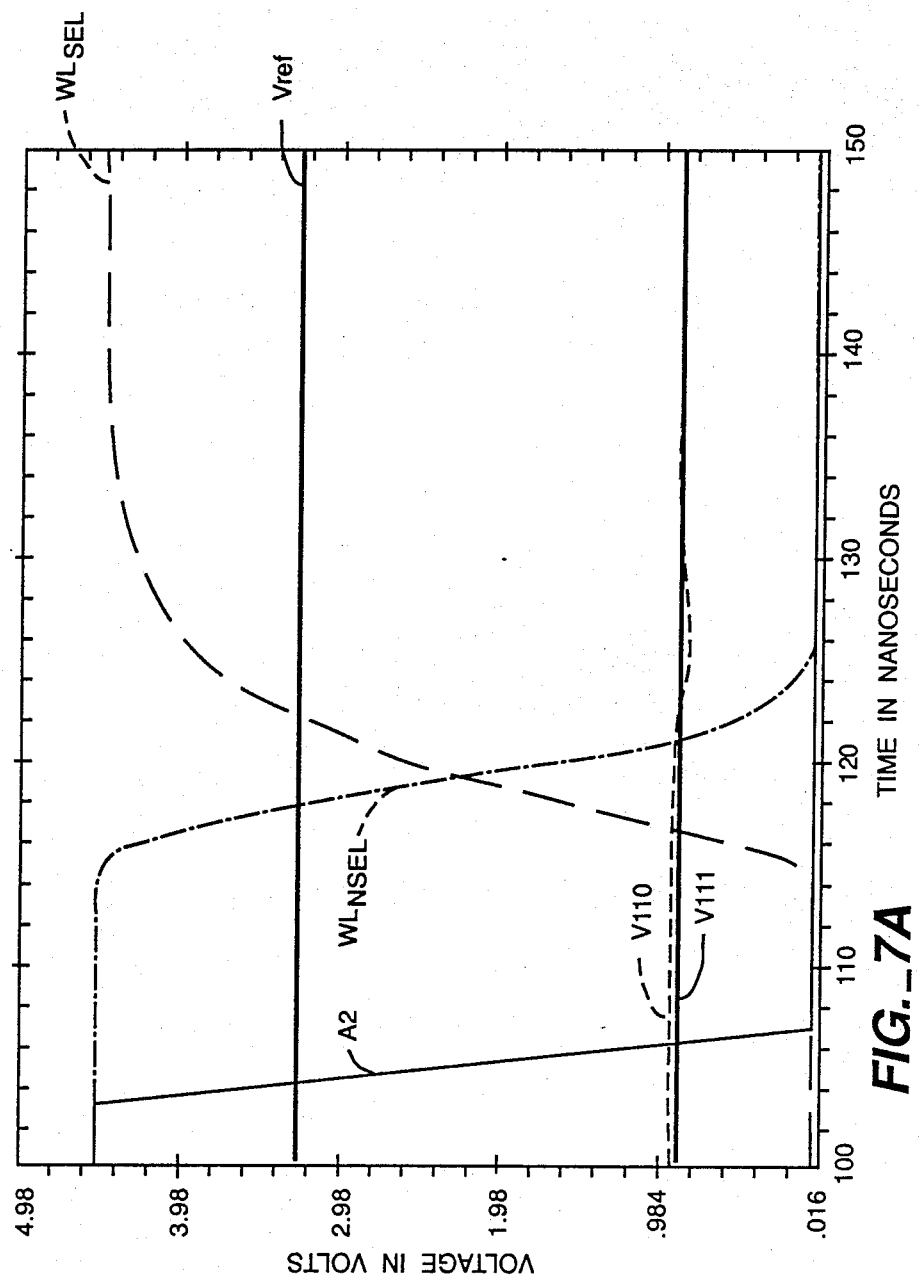

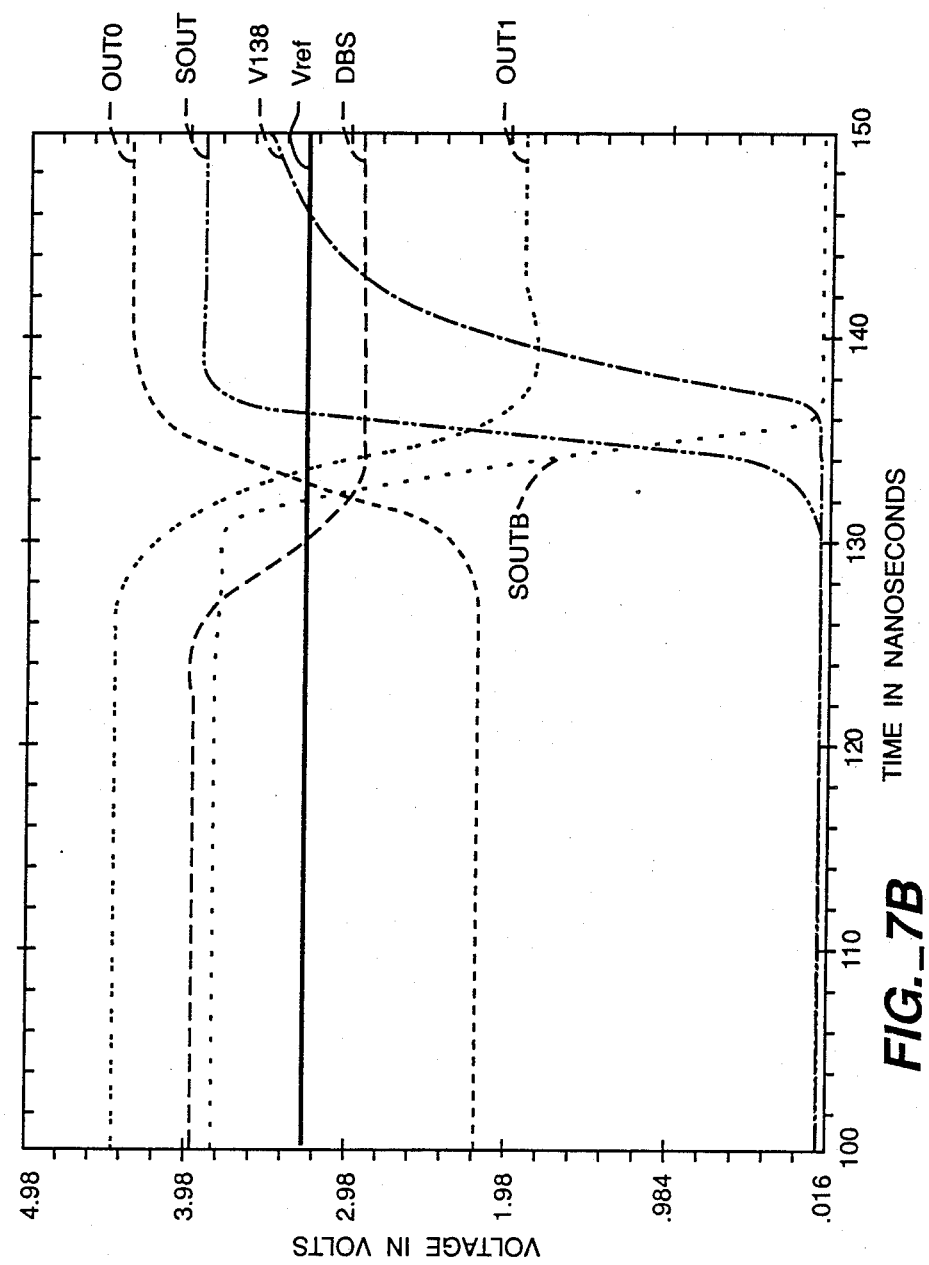
FIG._7B

DIFFERENTIAL SENSE AMPLIFIER CIRCUIT FOR HIGH SPEED ROMS, AND FLASH MEMORY DEVICES

BACKGROUND OF THE INVENTION

This invention relates to floating gate memory circuits such as EPROMs and flash memory devices. This invention also relates to floating gate memory output circuits.

Typical EPROMs comprise an array of floating gate transistors such as transistor 1 which is selectively coupled to a biasing circuit 2 and a first input lead 3 of a sense amplifier 4. When it is desired to read the data stored in transistor 1, the voltage at control gate 5 is raised, e.g. to about 5 volts. If the floating gate of transistor 1 is electrically neutral, the voltage at input lead 3 will drop when the voltage at control gate 5 increases, whereas if the floating gate is negatively charged, the voltage at input lead 3 will not drop. Sense amplifier 4 compares the voltage at input lead 3 with a reference voltage $V_{ref}$ provided by a reference voltage generator 6 and generates therefrom an output signal on an output lead 7 in response thereto. The signal on output lead 7 is communicated via a tri-state buffer 8 to an output pin 9.

One of the most important performance parameters of an EPROM is the propagation delay between the time a signal is applied to input lead 3 and the time an output signal is provided on pin 9 by buffer 8. Specifically, it is desirable to minimize the propagation delay.

One technique for minimizing the propagation delay time of an EPROM is to construct EPROM cells comprising two floating gate transistors. The first transistor stores a first binary value while the second transistor stores a second value opposite the first value. The drain of the first and second transistors are coupled, via biasing circuitry, to a differential sense amplifier. It has been found that circuits constructed in this manner provide fast access times. Such circuits are discussed by Zeman et al. in "A 55ns CMOS EEPROM", published at the 1984 IEEE International Solid-State Circuits Conference, pages 144-145 and by Pathak et al. in "A 25ns 16k CMOS PROM Using a 4-Transistor Cell", published at the 1985 IEEE Solid-State Circuits Conference, pages 162-163, incorporated herein by reference. Unfortunately, memory cells employing two or more transistors are large and thus expensive to build. It would be desirable to obtain fast EPROM access times without using a multiple transistor cell.

SUMMARY OF THE INVENTION

An improved floating gate memory device constructed in accordance with my invention provides reduced propagation delay between the time a floating gate transistor is addressed and the time an output signal is provided on an output pin.

In one embodiment of my invention, the floating gate memory device includes at least one floating gate transistor, a first bias circuit for biasing the floating gate transistor and for amplifying the drain voltage of the floating gate transistor, a reference voltage transistor, and a second bias circuit for biasing the reference voltage transistor and amplifying the drain voltage of the reference voltage transistor. The output signal from the second bias circuit serves as a reference voltage.

A first sense amplifier has an inverting input lead coupled to the first bias circuit and a noninverting input lead coupled to the second bias circuit, while a second sense amplifier has an inverting input lead coupled to the second bias circuit and a noninverting input lead which receives the output voltage from the first bias circuit. The first sense amplifier is coupled via buffer circuitry, to a first output transistor, which is coupled between the memory device output lead and a first electrical potential supply lead. The second sense amplifier is coupled via buffer circuitry, to a second output transistor, which is coupled between the memory device output lead and a second electrical potential supply lead. I have discovered that by using two sense amplifiers coupled in the above-described manner instead of a single sense amplifier, I can enhance the speed of the memory device. The reason for this is described in more detail below.

In one embodiment of my invention, the memory device includes a plurality of sense amplifiers for providing a multi-bit output data word. Associated with each sense amplifier is a column of reference voltage transistors and a circuit for biasing the column of reference transistors. I have discovered that providing a plurality of columns of reference transistors, instead of providing only a single column of reference transistors, enhances performance of the memory device. Specifically, providing several columns of reference transistors, each located in proximity to a group of floating gate transistors, ensures that the electrical characteristics of the group of floating gate transistors and reference transistors will be closely matched.

The operation of the memory device is better understood with reference to the detailed description below.

BRIEF DESCRIPTION OF THE DRAWINGS

FIG. 1 schematically illustrates a prior art EPROM.

FIG. 2 schematically illustrates an EPROM constructed in accordance with a first embodiment of my invention.

FIG. 3 an EPROM constructed in accordance with a second of my invention.

FIG. 4 schematically illustrates inverter 42 and gates 48 and 54 of FIG. 2.

FIG. 5 schematically illustrates level shifter 134 and NOR gate 142 of FIG. 3.

FIGS. 6A and 6B are timing diagram from a computer simulation showing various signals within the circuit of FIG. 3 when a change of the address on the EPROM address bus causes a different bit line to be addressed.

FIGS. 7A and 7B are a timing diagram from a computer simulation showing various signals within the circuit of FIG. 3 when a change of address on the EPROM address bus causes a different word line to be addressed.

DETAILED DESCRIPTION

FIG. 2 illustrates an EPROM circuit 10 including an array of floating gate transistors 12, arranged into rows and columns, each row being coupled to one of word lines WL-1 to WL-n, each column being coupled to one of bit lines BL-1 to BL-m. (EPROM circuit 10 also includes a column of reference cells, discussed below, coupled to a reference bit line BR.) A word line decoder 14 receives a first group of address signals on an address bus 16 and drives word lines WL-1 to WL-n in response thereto, while a bit line decoder 18 receives a second group of address signals and selects one of bit lines BL-0 to BL-m in response thereto. Bit line decoder 18 drives a group of output lines 20, which selectively turn on bit line decode transistors 22 to selectively couple one of bit lines BL-0 to BL-m to a node 24. Included within transistors 22 are transistors 22a and 22b having drains coupled to node 24. The source connections of transistors 22a and 22b are not shown to simplify the illustration, but the sources of transistors 22a and 22b are typically connected to a set of bit line decode transistors such as transistors 22c, 22d and 22e, which in turn are coupled to associated bit lines (not shown).

The bit line coupled to node 24 is biased by a voltage bias circuit 26 such that when one of floating gate transistors 12 is being read, the voltage at node 24 is approximately 1.50 volts if the floating gate transistor stores a one, and is about 1.55 volts if the floating gate transistor stores a zero. (The reason node 24 does not get discharged to zero volts is that as the voltage of node 24 drops to about 1.5 volts, transistor 26d starts to turn off, the voltage at the gate of transistor 26b starts increasing, and transistor 26b starts permitting more current to flow to node 24.) A node 28, coupled to node 24 via an N channel MOS transistor 26b, receives about 3 volts when the floating gate transistor being read stores a one and a voltage of 4 volts when the transistor being read stores a zero. (The reason for the difference in voltage swings at nodes 24 and 28 is that bias circuit 26, which comprises transistors 26a to 26d, serves as an amplifier.) Node 28 is coupled to a differential sense amplifier 32 via a first sense amplifier input lead 34. A reference voltage circuit 35 coupled to reference bit line BR drives a second sense amplifier input lead 36 with a voltage Vref such that when the voltage at sense amplifier input lead 34 exceeds the voltage at sense amplifier input lead 36, the voltage at sense amplifier output lead 37 is about 2 volts, whereas when the voltage at lead 36 exceeds the voltage at lead 34, the voltage at output lead 37 is about 4.5 volts.

Reference voltage generator 35 is coupled to reference bit line BR, which in turn is coupled to a column of reference transistors, each reference transistor having an electrically neutral floating gate. Transistors 35a to 35d bias lead 36 in the same manner that transistors 26a to 26d bias node 28. Transistors 35e and 35f provide an electrical resistance which simulates the resistance of bit line decode transistors 22, while an extra P channel transistor 35g is coupled in parallel with transistor 35a to ensure that the voltage at lead 36 will be higher than the voltage at lead 34 when lead 34 is coupled to a transistor having an electrically neutral floating gate.

Lead 37 is coupled to a CMOS inverter 42 which in turn drives an input lead 44a of an output buffer circuit 44. Buffer circuit 44 also receives output enable signals OE and $\overline{OE}$ such that when signal OE is high (and therefore signal $\overline{OE}$ is low), buffer circuit 44 drives an output lead 46 with either VCC or ground, depending on the signal at lead 44a. In contrast, when signal OE is low and signal $\overline{OE}$ is high, transistors 60 and 62 are both off, and thus buffer circuit 44 is in a tri-state mode.

Buffer circuit 44 includes a NAND gate 48 which drives an inverter 50, which in turn drives an inverter 52, which drives the gate of P channel output transistor 60. Buffer circuit 44 also includes a NOR gate 54 which drives an inverter 56, which drives an inverter 58, which in turn drives N channel output transistor 62. This structure is provided, in part, because it is necessary to be able to drive lead 46 with a high output current (e.g. about 2.4 mA), which requires that output transistors 60 and 62 be large and thus somewhat capacitive. To drive transistors the size of transistors 60 and 62 requires that either the circuitry driving transistors 60 and 62 comprise large transistors, or that output buffer 44 be slow to allow time for inverters 52 and 58 to charge and/or discharge the gates of transistors 60 and 62. Since speed is important in most EPROM designs, inverters 52 and 58 generally comprise large transistors, but not as large as transistors 60 and 62. Similarly the transistors within inverters 50 and 56 are smaller than the transistors in inverters 52 and 58, the transistors in gates 48 and 54 are smaller than the transistors in inverters 50, 56, and so on. Providing inverters 50 to 58 optimizes the speed of output buffer 44. (It is noted that inverter 42 comprises small transistors, since the output impedance of sense amplifier 32 is large, and it is necessary to minimize input capacitance of inverter 42.)

In one embodiment of my invention, EPROM 10 includes eight sense amplifiers and output buffer circuits for providing an eight bit output word. Of importance each sense amplifier is connected to an associated bias circuit such as circuit 35 which in turn is coupled to an associated column of reference transistors such as the transistors connected to line BR. Of importance, the reference transistors are located adjacent to a block of associated EPROM transistors and bit line decoders so that if transistor fabrication parameters (e.g. dopant concentrations or oxide thicknesses) vary across the EPROM surface, the parameters of the reference transistors will similarly vary, and will track those of the associated EPROM cell transistors and bit line decoders. Therefore, voltage Vref is more likely to be between the bit line voltage when a zero is being read and the bit line voltage when a one is being read.

In one embodiment, EPROM 10 is a 256k EPROM, organized into 512 columns by 512 rows of transistors, and is configured to provide an 8-bit output word. Thus, the 512 columns are organized into 8 groups of 64 columns, each group corresponding to an output lead of the EPROM. Each column of reference transistors is located in the middle of an associated group of 64 columns.

In contrast, in prior art EPROMs, there is typically one column of reference transistors for the entire EPROM. Thus, if the prior art EPROM provides an 8-bit output word, and includes 8 sense amplifiers such as sense amplifiers 32, each sense amplifier is coupled to the same column of reference transistors. I have discovered that providing a plurality of columns of reference transistors also enhances the speed of the EPROM by ensuring a margin between voltage $V_{ref}$ and the voltage at lead 34 when a transistor storing a 1 or a 0 is being read.

An EPROM 100 constructed in accordance with a second embodiment of my invention is illustrated in FIG. 3. EPROM 100 includes a bit line BL coupled to the drain of an EPROM cell transistor 102, as well as the drain of a column of EPROM cell transistors (not shown). A word line decoder 104 drives the control gate of transistor 102, along with the control gates of other rows of EPROM cell transistors (not shown). A pair of bit line select transistors 106 and 108 are provided to selectively couple bit line BL to a node 110 in response to control signals generated by a bit line decoder 112. Other bit lines (not shown) are coupled to node 110 via corresponding other select transistors (not shown) which are also controlled by bit line decoder 112.

A bias circuit 114 biases node 110 so that if a floating gate transistor coupled to node 110 is being read, when the transistor stores a zero, node 110 is held at about 1.55 volts, whereas if the transistor stores a one, node 110 is at 1.50 volts. The voltage at a node 110 is amplified by bias circuit 114 in the same manner as bias circuit 26, and provides an output signal on lead 118. Lead 118 is coupled to a pair of differential sense amplifiers 120 and 122, identical to sense amplifier 32 of FIG. 2.

Also illustrated in FIG. 3 is a reference voltage generator 124 for providing a reference voltage Vref on an output lead 126, which is coupled to differential sense amplifiers 120 and 122. Reference voltage generator 124 includes transistors 124a to 124g which operate in the same manner as transistors 35a to 35g discussed above. Reference transistor 125 is typically one transistor within a column of reference transistors.

Sense amplifiers 120 and 122 include output leads 128 and 130, coupled to level shifter circuits 132 and 134, respectively. Of importance, the output voltage swing of signal OUT0, provided at output lead 128, extends from about 2.2V to 4.4V, while the voltage swing of signal OUT1 on output lead 130 extends from about 1.9 volts to 4.4 volts. Level shifter 132 receives signal OUT0 and generates therefrom signal SOUTB, which has a voltage swing between about zero and 3.8 volts. Similarly, level shifter 134 receives signal OUT1 and generates therefrom signal SOUT, which has a voltage output swing between about zero and about 3.9 volts.

Signals SOUTB and SOUT drive output buffer circuit 136, which in turn drives output lead 138 with output data in response thereto. Circuit 136 includes CMOS NOR gates 140 and 142 which receive signals SOUTB and SOUT, respectively, along with an output enable signal $\overline{OE}$.

Signal SOUTB is high when the signal at node 116 exceeds Vref which causes the output signals from NOR gate 140, inverter 144, and inverter 146 to be low, high, and low, respectively, thereby turning off transistors 148, 150, and 152. When signal SOUTB is high, signal SOUT is low. Thus when signal $\overline{OE}$ and SOUT are low, the output signals of NOR gate 142, inverter 153, and inverter 154 are high, low, and high, respectively, turning on transistor 156 and grounding output lead 138.

Conversely, when signal SOUT is high, the output signal of inverter 154 is low and transistor 156 is off. When signal SOUT is high, signal SOUTB is low. When signal SOUTB is low and signal $\overline{OE}$ is low, the output signal from NOR gate 140 is high, the output signal from inverter 144 is low (thereby turning on transistor 148 and coupling output lead 138 to VCC) and the output signal of inverter 146 is high, thereby turning on transistor 152 (also coupling lead 138 to VCC) and turning on transistor 150 (thereby pulling the gate of transistor 156 low and ensuring that transistor 156 is off).

One important feature of my invention is that sense amplifiers 120 and 122 each drive a single transistor. Thus, the load driven by sense amplifiers 120, 122 is half of the load driven by sense amplifier 32 in FIG. 2. This enhances the speed of EPROM 100 compared with the speed of EPROM 10.

Another novel feature of my invention is that instead of using a single inverter 42 to drive NAND gate 48 and NOR gate 54, level shifter 132 drives a single CMOS NOR gate, and level shifter 134 drives a single CMOS NOR gate. Thus, the capacitive load on level shifters 132 and 134 is less than the capacitive load on inverter 42. This is because inverter 42 must drive 4 transistors (a P and N channel transistor within NAND gate 48 and a P and N channel transistor within NOR gate 51 as shown in FIG. 4) while level shifters 132 and 134 only drive one N channel transistor and one P channel transistor (FIG. 5).

Using a pair of sense amplifiers and level shifters can further enhance the speed of EPROM 100 for the following reason. If the signal on lead 118 changes state, signals SOUT and SOUTB will change state. The trip points of sense amplifiers 120 and 122 and level shifters 132 and 134 may vary, e.g. because of variations in dopant concentrations, oxide thicknesses, etc., so that signal SOUTB may lag or lead signal SOUT. Even if this occurs, whichever one of signals SOUT, SOUTB is faster will begin changing the state of the output signal on lead 138, even though the slower of signals SOUT, SOUTB may not have propagated through output circuit 136. Thus, when the slower of signals SOUT, SOUTB propagates through circuit 136, the time required to finish changing the state of the signal on output lead 138 will be less than if only the slower of signals SOUT, SOUTB were used to control transistors 148, 152 and 156.

FIGS. 6A and 6B are a computer simulation timing diagram of various signals generated by the circuit of FIG. 3 when the output signal on lead 138 goes from a high state to a low state as a result of an address change, which causes a different bit line to be selected as a source of output data. In FIG. 6A, address signal A1 changes, causing bit line decoder output signal BL$_{NSEL}$ to go inactive, thereby decoupling a first bit line (not shown) from bias circuit 114. The change in address signal A1 also causes bit line decoder output signal BL$_{SEL}$ to go active, thereby coupling bit line BL to bias circuit 114. FIGS. 6A and 6B also illustrate the resulting change in voltages at various nodes and leads of FIG. 3.

FIGS. 7A and 7B illustrate various signals in the EPROM of FIG. 3 when a change in address signal A2 causes a word line WL$_{NSEL}$ to go inactive, thereby turning off a first transistor in the array (not shown), and causing word line WL$_{SEL}$ to go active, thereby turning on transistor 102. This causes the EPROM output signal to go from a low state to a high state. As can be seen, in each case, the delay between the time signal DBS on lead 118 changes state and the time output signal Vout and lead 138 changes state is less than 40 ns. This constitutes a major improvement over typical prior art EPROMs, which generally exhibit a delay time over 100 ns.

While the invention has been described with regard to specific embodiments, those skilled in the art will recognize that changes can be made in form and detail without departing from the spirit and scope of the invention. For example, the present invention can be used in conjunction with any floating gate memory device. In addition, in other embodiments, more than one column of reference transistors are associated with each sense amplifier, to ensure a closer match of electrical characteristics between the reference transistor and the transistor being read. Accordingly, all such changes came within the present invention.

I claim:
1. A memory circuit comprising:
   at least one memory cell for storing data;
   means for providing a data signal corresponding to the data stored in said memory cell;

means for providing a reference voltage;

first sense amplifier means having an output lead, an inverting input lead receiving said reference voltage and a noninverting input lead receiving said data signal;

second sense amplifier means having an output lead, noninverting input lead receiving said reference voltage, and an inverting input lead receiving said data signal;

a memory circuit output lead;

first means for coupling said memory circuit output lead to a first voltage in response to the signal on said output lead of said first sense amplifier means; and second means for coupling said memory circuit output lead to a second voltage in response to the signal on said output lead of said second sense amplifier means.

2. Memory circuit of claim 1 further comprising a level shifter including first and second MOS transistors coupled in series between first and second voltage supply leads, said first sense amplifier means driving the gate of a first one of said MOS transistors, the gate of the other of said MOS transistors receiving a bias voltage.

3. Memory circuit of claim 1 wherein said first means comprises a first mos transistor coupled between said output lead and a first voltage supply lead, and wherein said second means comprises a second MOS transistor coupled between said output lead and a second voltage supply lead.

4. A memory circuit comprising:

an array of floating gate transistors;

a plurality of sense amplifiers, each sense amplifier being associated with a group of floating gate transistors within said array, each sense amplifier including first and second leads;

decode means for selectively coupling one of said floating gate transistors within one of said groups to the first lead of said sense amplifier associated with said group; and a plurality of reference voltage generators, each being associated with one of said sense amplifiers and each providing a reference voltage on the second lead of said associated sense amplifier.

5. Circuit of claim 4 wherein each reference voltage generator comprises a column of reference transistors.

6. Memory circuit of claim 3 further comprising:

third means for providing a gate control signal on the gate of said first MOS transistor responsive to the signal on said output lead of said first sense amplifier means;

fourth means coupled to the gate of said second MOS transistor for providing a signal on the gate of said second MOS transistor responsive to the signal on said output lead of said second sense amplifier means; and fifth means, coupled to the gate of said second MOS, transistor for driving the gate of said second MOS transistor with a signal responsive to the signal on said output lead of said first sense amplifier means.

* * * * *